United States Patent
Hagge et al.

(10) Patent No.: US 7,091,927 B1
(45) Date of Patent: Aug. 15, 2006

(54) DISPLAY INCLUDING TILES AND A METHOD OF OPERATING AND MANUFACTURING THE SAME

(75) Inventors: John K. Hagge, Andover, MA (US); John C. Mather, Cedar Rapids, IA (US); Ross K. Wilcoxon, Cedar Rapids, IA (US); James R. Wooldridge, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 325 days.

(21) Appl. No.: 10/606,725

(22) Filed: Jun. 26, 2003

(51) Int. Cl.
*G09G 5/00* (2006.01)
(52) U.S. Cl. .......................................... 345/1.3; 345/82
(58) Field of Classification Search ................. 345/1.1, 345/1.3, 82, 87, 55
See application file for complete search history.

(56) References Cited

U.S. PATENT DOCUMENTS

| | | | |
|---|---|---|---|
| 5,805,117 A * | 9/1998 | Mazurek et al. ............. 345/1.3 |
| 6,252,564 B1 * | 6/2001 | Albert et al. ................ 345/1.3 |
| 6,498,592 B1 * | 12/2002 | Matthies ..................... 345/1.1 |
| 6,849,935 B1 * | 2/2005 | Palanisamy ................. 257/678 |

\* cited by examiner

*Primary Examiner*—Amr A. Awad
*Assistant Examiner*—Stephen G. Sherman
(74) *Attorney, Agent, or Firm*—Nathan O. Jenson; Kyle Eppele

(57) ABSTRACT

A mosaic display system includes a number of tiles. Each of the tiles includes a matrix of pixel elements. The pixel elements selectively provide light at a first surface of the tile in response to address signals. The pixel elements are coupled to an address circuit via conductors at a second surface. The first surface is opposite the second surface. The display system also includes a medium having a mounting surface. The tiles are attached to or above the mounting surface.

19 Claims, 15 Drawing Sheets

DISPLAY INCLUDING TILES AND A METHOD OF OPERATING AND MANUFACTURING THE SAME

FIELD OF THE INVENTION

The present invention relates to displays. More particularly, the present invention relates to an advantageous display that is comprised of individual tiles and to methods of operating and manufacturing the same.

BACKGROUND OF INVENTION

Displays, such as cockpit control displays, cathode ray tubes (CRTs), electronic billboards, viewing screens, monitors, projection displays, liquid crystal displays (LCDs), etc., are used to display information to one or more users. Various technologies have been utilized to manufacture large displays which can be viewed at a relatively wide range of viewing angles and under a wide range of ambient light conditions. However, larger displays are generally more expensive and/or have lower picture quality than smaller displays.

One conventional method for achieving a larger screen system is to utilize multiple display units (CRTs, LCDs, or other screens) arranged in a matrix. The multiple display units are disposed closely adjacent to each other to appear as a single larger screen.

Conventional systems composed of multiple display units require infrastructure located at the edges of each individual display unit. The infrastructure prevents a smooth transition of the overall picture across the boundary of individual display units because some separation of the individual display units is necessary to accommodate the infrastructure. For example, connectors for liquid crystal display (LCD) units are generally provided on the edges of the LCD screen and such connectors interfere with the viewing quality of the larger screen. In another example, CRT display units (CRTs) have mechanical infrastructure (i.e., are contained in individual housing about the periphery) that is visible, thereby affecting the viewing quality of the larger screen.

Thus, there is a need for a larger viewing screen or display which can be manufactured from smaller screen units without sacrificing display quality. Further still, there is a need for a low cost method of manufacturing a large display or screen. Yet further still, there is a need for operating and manufacturing a screen or display which does not include infrastructure along the edges which can adversely affect viewing unit quality. Even further still, there is a need for a low cost method of manufacturing large screens using individual tiles.

There is also need for a large display arrangement having relatively low hardware and assembly costs. Further, there is a need to use other technologies than LCD and CRT technologies in a large screen system.

SUMMARY OF THE INVENTION

In accordance with an exemplary embodiment of the present invention, display is comprised of one or more sub-displays that are tiled together to form a complete display. Tiles are composed of a pixel web that contains the light emitting pixels, an interconnect web which routes the control signals to individual pixels, and an interposer that contains local row and column driver devices to provide pixel control signals. All electrical connections between the pixel web and interconnect web and between the interconnect web and the interposer utilize interconnections in a direction that is perpendicular to the plane of the tile (e.g., the Z direction). This allows the entire tile to contain pixels, and therefore there is no border at the edge of an individual tile. Multiple tiles can therefore be placed immediately adjacent to one another to produce a larger display.

An embodiment relates generally to a display system. The display system includes a number of tiles. Each of the tiles includes a matrix of pixel elements. The pixel elements selectively provide light at a first surface of the tile in response to address signals. The pixel elements are coupled to an address circuit via conductors at a second surface. The first surface is opposite the second surface. The display system also includes a medium having a mounting surface. The tiles are attached to or above the mounting surface.

Yet another exemplary embodiment relates to a cockpit display. The cockpit display includes display tiles. At least one tile of the display tiles includes a matrix of pixel elements on a pixel web. The pixel elements selectively provide light at a first surface of the pixel web. The pixel web includes conductors at a second surface of the pixel web. The first surface is opposite the second surface. The cockpit display also includes a medium including a mounting surface. The display tiles are attached to or above the mounting surface at the first surface.

Yet another exemplary embodiment relates to a display apparatus. The display apparatus includes first and second means for providing light from pixel elements at a first surface, first and second means for providing paths for electric signals, and means for providing the electric signals to the means for providing paths. The first surface is opposite a second surface. The second surface includes contacts. The paths are connected to the contacts. The first and second means for providing paths are mounted behind the second surface and are closer to the second surface than the first surface. The electric signals control the light from the pixel elements.

Still another exemplary embodiment relates to a method of operating a display. The method includes providing first electric signals from behind a back surface of a first pixel web to the back surface of the first pixel web, providing light at a front surface of the first pixel web on the first tile in accordance with the first electric signal; providing second electric signals from behind a back surface of a second pixel web to the back surface of the second pixel web, and providing light at a front surface of the second pixel web on a second tile in accordance with the second electric signals. The first pixel web is located on a first tile and the second pixel web is located on a second tile.

The present invention still further relates to a method of manufacturing a display system. The method includes providing a number of tiles, providing a transparent carrier medium and attaching the tiles to the carrier medium. Each of the tiles has a first surface and a second surface parallel with a first plane. The first surface includes a plurality of pixel elements for selectively providing light. The second surface includes a plurality of contacts electrically associated with the pixel elements.

Still another exemplary embodiment relates to a display including a number of tiles. Each of the tiles has a first surface and a second surface parallel with the first plane. The first surface includes pixel elements for selectively providing light. The second surface includes contacts electrically associated with the pixel elements. Conductive vias extend from the contacts to the pixel elements in a direction relatively perpendicular to the first plane.

BRIEF DESCRIPTION OF THE DRAWINGS

The exemplary embodiments will hereafter be described with reference to the accompanying drawings, wherein like reference numerals denote like elements in the various drawings, and.

DETAILED DESCRIPTION OF PREFERRED AND EXEMPLARY EMBODIMENTS

Figure 1:
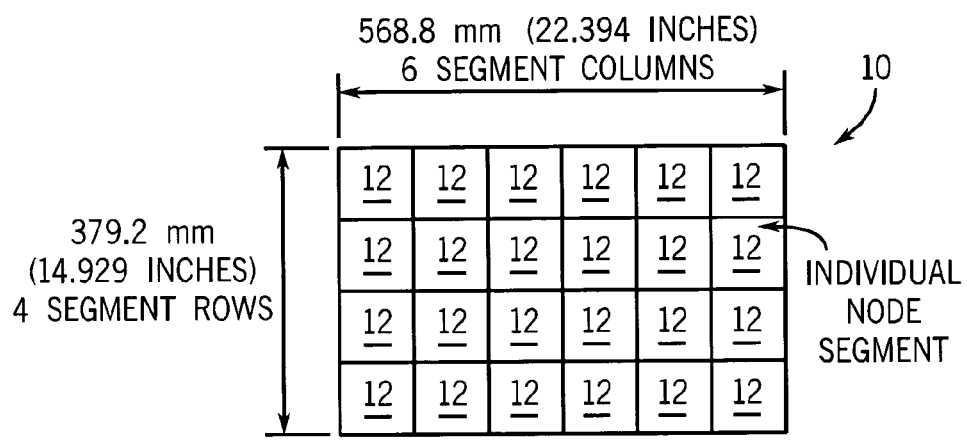
FIG. 1 is a general block diagram of a display system including a matrix of display tiles in accordance with an exemplary embodiment.

With reference to FIG. 1, a display system 10 can be used to provide fixed or variable information in response to electronic signals. Display system 10 can be based upon a number of display technologies and is preferably an emissive display, such as, an organic light emitting diode (OLED) or organic emissive device (OED) display.

Display system 10 can be utilized in numerous applications and is not limited to provision in any particular application or environment. However, display system 10 is particularly useful in cockpit displays due to its relatively thin profile with respect to its display area. Cockpit displays can be used in airplanes, helicopters, ships, boats, automobiles, etc. Display system 10 can also be used in control rooms, operating rooms, or any mobile device. Further, display system 10 is advantageous in larger display systems, such as those utilized in electronic signs, scoreboards, billboards, and other public viewing systems. Further still, display system 10 can be utilized in any entertainment medium in which electronically generated pictures are desired.

System 10 is preferably a mosaic tile design utilizing OLED pixel elements interconnected through a Z axis (i.e., perpendicular to the plane of the viewing surface of display 10). Display system 10 is preferably comprised of nixel-tiled segments (tiles 12). Each of the tiled segments is based on a pixel node or "nixel" node-segment containing its own set of row and column driver integrated circuits (ICs). In one embodiment, the row and column driver ICs can be activated via wireless communications with remote, off-display electronics.

Tiles 12 preferably have a zero-bezel characteristic. Tile 12 preferably has little or no infrastructure associated with its border or perimeter. In one embodiment, all required interconnections for tile 12 are accomplished in the Z axis through the back of display system 10. Display system 10 can be populated by a large number of tiles 12 to achieve very large displays of any size which present high-resolution seamless images due to the zero bezel characteristic. For example, display system 10 can be utilized as a billboard or theatrical screen for a large number of viewers or a large audience.

In a preferred embodiment, display system 10 includes a number of display tiles 12. In the embodiment shown in FIG.

1, display system 10 includes a matrix of 6×4 display tiles 12. Although shown as a rectangular-shaped display system 10, display system 10 can be square-shaped, circular-shaped, trapezoidal-shaped or any shape appropriate for the display application. Further, although display tiles 12 are shown as rectangular or square-shaped tiles, other shapes can be utilized depending upon application parameters and design criteria. The individual shapes of tiles 12 can also be shaped differently with respect to each other. For example, certain tiles 12 can be trapezoidal, while others are rectangular or triangular.

While display systems may be produced in a variety of shapes and sizes, an exemplary embodiment of a display system includes six columns of display tiles 12 and four rows of display tiles 12. One exemplary dimension for the display is approximately 570 millimeters by 380 millimeters, although such a configuration is not intended to limit the scope of the invention as expressed in the claims.

Figure 2:
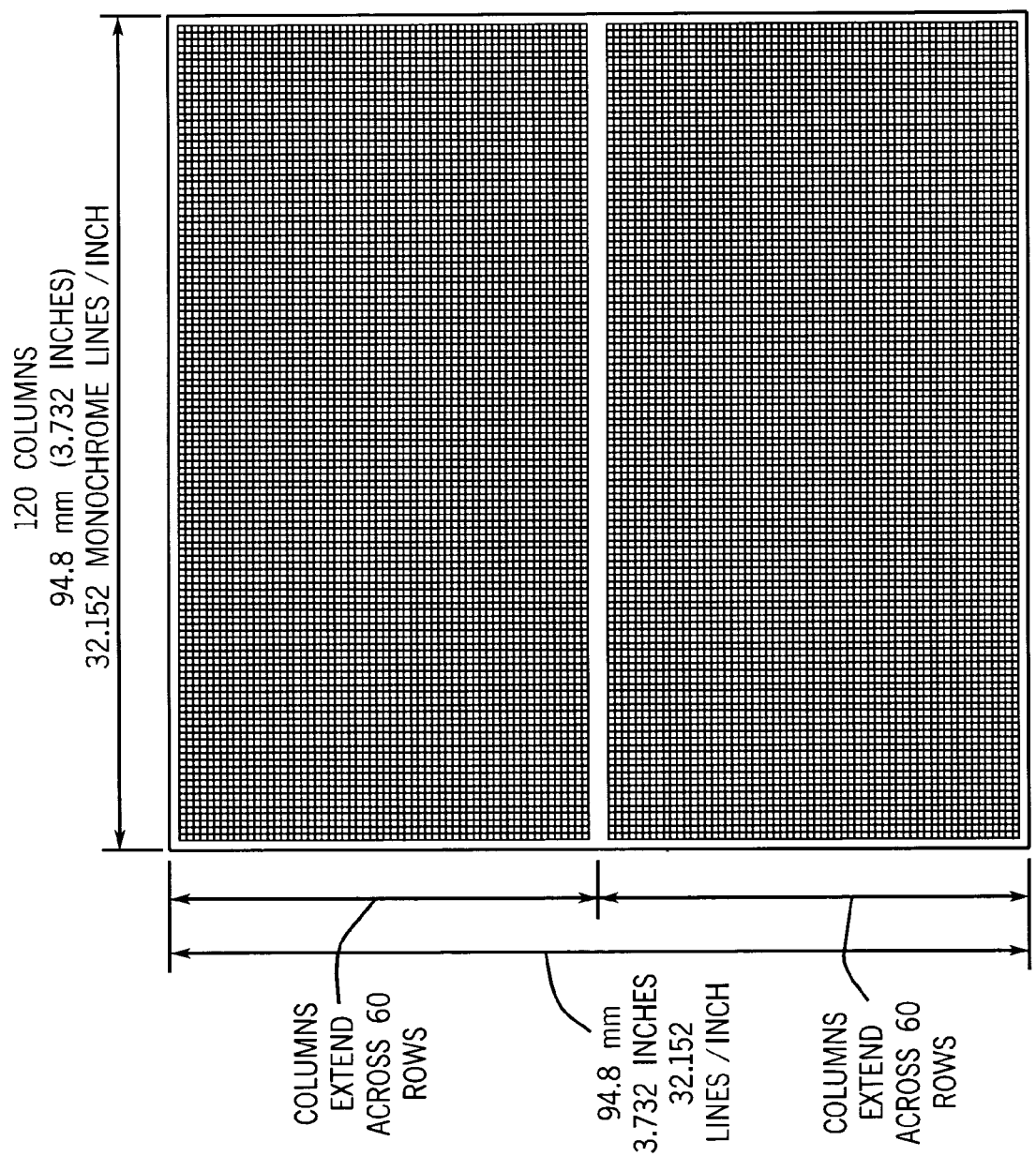
FIG. 2 is a general schematic block diagram of a display tile for use in the display system illustrated in FIG. 1 in accordance with another exemplary embodiment.

With reference to FIG. 2, each display tile 12 includes pixels or pixel elements. In a preferred embodiment, pixels are arranged in 120 columns and two sets of rows, each set including 60 rows. As discussed above, display tile 12 can have a variety of shapes and sizes.

Pixel elements associated with display tile 12 can be color or monochromatic pixel elements. Preferably, the pixel elements are generated by light emitting devices such as OLED or OED devices. In one embodiment, red-green-blue pixels are provided for color displays. In another embodiment, pixel elements are monochromatic.

Figure 3:
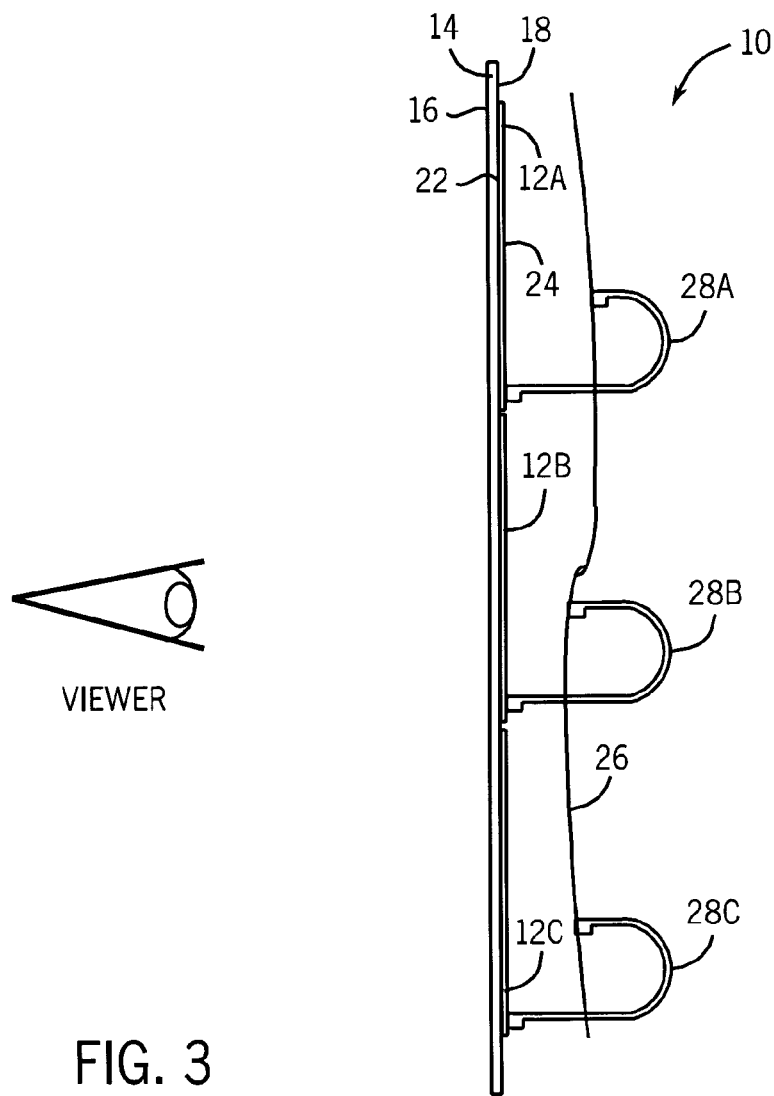
FIG. 3 is a planar side view schematic drawing of a portion of the display system illustrated in FIG. 1 showing a carrier medium, a number of display tiles and a flexible circuit board for housing off-display driver electronics in accordance with still another exemplary embodiment.

With reference to FIG. 3, a portion of system 10 is shown. System 10 includes a carrier medium 14 upon which display tiles 12A, 12B and 12C are attached. Medium 14 is preferably a transparent assembly such as a clear plastic film capable of carrying tiles 12A–C. In one embodiment, display 10 is shatter resistant and medium 14 is a low cost, flexible film.

Medium 14 can be a film that is compatible with high volume roll-to-roll web processing, such as a polyester material. Medium 14 includes a viewing surface 16 and an attachment surface 18. Tiles 12A–C each include a pixel surface 22 and a back surface 24. Preferably, light is provided from pixel surface 22 through medium 14 to a viewer. Tiles 12A–C are mounted to or above attachment surface 18 (behind surface 18).

In a preferred embodiment, all off-display drive electronics are mounted on a circuit board 26. Circuit board 26 can be a conventional flex circuit board connected to tiles 12 via flex circuit cables 28A–C. The use of flexible materials for medium 14, circuit board 26 and cables 28A–C provides significant advantages associated with the packaging of system 10. For example, curved displays for superior picture quality can be easily configured for system 10. Further, orientations for display system 10 can be achieved which are highly suitable in applications such as airplane avionics where space both in front of and behind display system 10 is a premium commodity.

Display system 10 can achieve an extremely thin profile. The exemplary embodiment of system 10 in FIG. 3 can achieve a profile having a total thickness of less than approximately 1 centimeter. System 10 can achieve the small thickness due to the use of a thin medium 14 with integral display drivers associated with tiles 12A–C and a thin bendable circuit board for circuit board 26. Circuit board 26 preferably houses off-display drive electronics. Further, the use of flexible components for tiles 12 as well as for other components of system 10 allows surface 16 to be formed into a three-dimensional shape that is optimized for viewing. Surface 16 can have a flat, concave, spherical, parabolic or convex shape.

In operation, the off-display drive electronics provide electric signals to tiles 12A–C via connectors 28A–C. Electric signals to tile 12A via connector 28A cause pixel elements on tile 12A to provide light. Similarly, electric signals to tile 12B via connector 28B cause pixel elements on tile 12B to provide light. The off-display drive electronics ensure that tiles 12A–C provide a coordinated picture for system 10.

Figure 4:
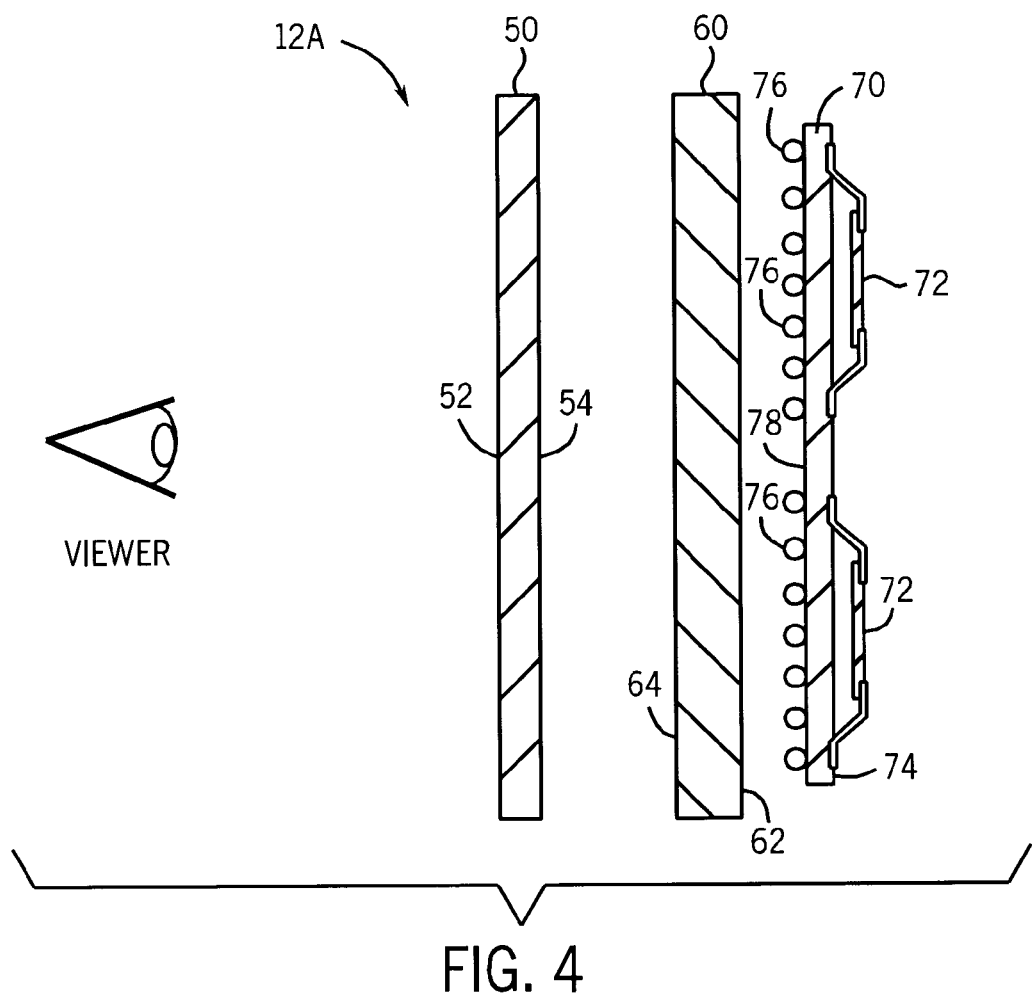
FIG. 4 is a more detailed side view schematic drawing of one of the display tiles illustrated in FIG. 2 showing a pixel web, an interconnect web and an interposer module in accordance with yet another exemplary embodiment.

With reference to FIG. 4, an exemplary tile 12, such as tile 12A shown in FIG. 3, includes a pixel web 50, an interconnect web 60, and interposer module 70. Pixel web 50 is preferably an OLED pixel web having a viewing surface 52 from which light is emitted. Surface 52 can be attached to attachment surface 18 of medium 14 (FIG. 3). Preferably, back surface 54 includes conductive lines or contacts for coupling to interconnect web 60.

Interconnect web 60 provides short paths to connect contacts on surface 54 to interposer 70. Interconnect web(s) 60 provides an electrical path for electrical signals that control the pixel elements associated with web 50. The electric paths are relatively perpendicular to surface 54 in that the paths travel from surface 64 in the Z direction so that infrastructure is not present about the periphery of web 50.

Interposer module 70 can include display circuitry such as integrated circuit row and column driver assemblies 72. Integrated circuits (ICs) can be mounted on a back surface 74 of interposer module 70 and are connected through conductive vias to contacts, such as, solder balls 76 on a surface 78. The display circuitry provides electric signals to web 60.

Driver assemblies 72 receive electronic signals from off-display drive electronics from connectors 28A–C (FIG. 3). Driver assemblies 72 can buffer, drive, and interpret the electronic signals to control the light output by each individual pixel element. Assemblies 72 provide drive signals to column and row lines associated with pixel web 50. Assemblies 72 can be custom designed ICs, application specific ICs (ASICs), programmable arrays, or a software controlled circuit.

Solder balls 76 are connected to contacts on a back surface 62 of interconnect web 60. In one embodiment, solder balls 76 are arranged similar to a Ball Grid Array (BGA) for interconnection to contacts on surface 62. Alternatively, solder balls 76 can be provided on surface 62 and contacts can be provided on surface 78. Conductive vias and conductive lines provide a connection from surface 62 to a front surface 64 of interconnect web 60. Surface 64 is connected to surface 54 of pixel web 50. Alternatively, webs 50 and 60 and module 70 can be electrically connected by any suitable packaging or connector technology that allows connection through the Z axis or without optical interference at the periphery of tile 12.

In operation, driver circuitry associated with assemblies 72 on back surface 74 of interposer module 70 provide electrical signals at surface 78 through solder ball 76 to interconnect web 60. Interconnect web 60 provides electrical signals from surface 62 to surface 64 for reception by pixel elements on pixel web 50. The electrical signals are provided to contacts or conductive lines associated with surface 54 so that the pixel elements provide light at surface 52.

Advantageously, the architecture of tiles 12 allows system 10 to drive pixel elements through the back side of system 10 (Z direction), rather than from the perimeter of the display. Such an approach allows production of borderless tile segments (tiles 12) which can be assembled to make much larger display systems. The architecture of system 10 can achieve larger sizes because connection circuitry is not constrained by the number of lines that can be fed in through the perimeter of tiles 12 or system 10. Instead, the entire back area associated with surfaces 64, 54 and 62 is available for interconnections.

Pixel web 50 is preferably fabricated from flexible film substrates including transparent column-line conductors, internal moisture barriers, insulator layers, rib structures, OLED pixels, and metal conductor cathode elements. Preferably, the transparent conductors are indium tin oxide (ITO) conductive-lines. Other transparent conductors may also be used in other exemplary and alternative embodiments. Conductive lines associated with a layer close to or integrated with surface 52 can be disposed in a first direction for connection to the OLED pixel elements (anode of OLED devices). Conductive lines associated with a layer close to or integrated with surface 54 can be disposed in a second direction orthogonal to the first direction for connection to the OLED elements (cathode of the OLED device). The conductive lines associated with surface 54 are not necessarily transparent or translucent. The substrate for pixel web 50 is preferably highly flexible.

Interconnect web 60 is preferably also fabricated from a flexible plastic film substrate. Interconnect web 60 includes metal conductor circuits (conductive lines and vias) which route signals from assemblies 72 to the appropriate cathode row and anode column line for pixel web 50. Interconnect web 60 is preferably thin (less than 100 microns) to maintain display flexibility. The conductor circuits associated with interconnect web 60 are not necessarily transparent or translucent and can be opaque.

Webs 50 and 60 and module 70 can be fabricated in accordance with the embodiments described in U.S. Pat. No. 6,421,033 assigned to Innovative Technology Licensing, LLC. Web processing techniques can be utilized to join webs 50 and 60.

Figure 5:
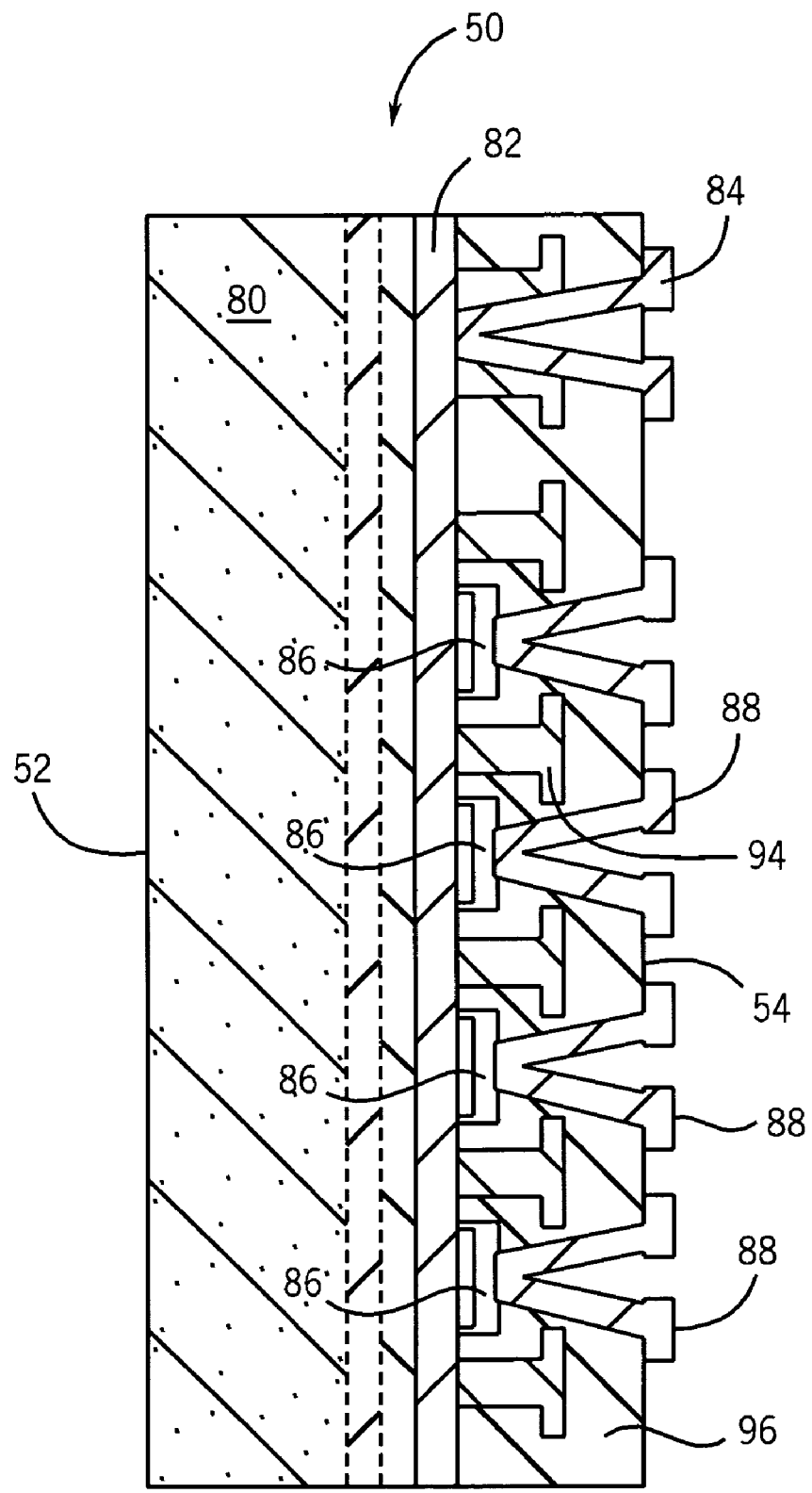
FIG. 5 is a more detailed cross sectional view schematic drawing of the pixel web illustrated in FIG. 4 in accordance with yet still another exemplary embodiment.

With reference to FIG. 5, a portion of pixel web 50 is shown. Web 50 includes a substrate that preferably includes advantageous optimal characteristics, a transparent conductor layer (e.g., an Indium Tin Oxide layer or other transparent conductor layer), and an integral moisture barrier. One substrate material that may be used is a Vitex® polyester film, although other materials may be used without departing from the scope of the invention as expressed in the claims. Substrate 50 preferably has advantageous optical characteristics, a transparent conductor layer (an ITO layer), and an integral moisture barrier. Pixel web 50 preferably has a similar flexibility to interconnect web 60.

In one exemplary embodiment, pixel web 50 includes a column line 82 which is an ITO column line. Column line 82 is electrically coupled to a column contact 84 and to the anode of OLED devices 86. Preferably, contact 84 is nickel material plated with gold and is located between selected row lines associated with contacts 88. Other materials may be used for contact 84 without departing from the scope of the invention as expressed in the claims.

Contact 84 is preferably a pad that is small enough not to interfere with visual appearance of pixel images. Contact 84 allows ITO interconnections to be made in the Z direction or at surface 54 of pixel web 50.

Pixel web 50 also includes contacts 88 similar to contacts 84. Contacts 88 are coupled to the cathode of OLED elements 86. Contacts 88 allow interconnections to be made in the direction parallel to the plane of the pixel tile of system 10. Contacts 88 can be disposed in a row direction, and line 82 can be disposed in a column direction. Contacts 88 are preferably nickel material plated with gold but may be made of different contact materials in alternative embodiments. Contacts 84 and 88 can have a V-cross sectional shape to increase the surface area for contact areas. Such a shape allows for greater dimensional tolerances when webs 50 and 60 are connected.

The placement of contacts 84 and 88 at surface 54 allow multiple segment displays to be tiled in a seamless mosaic arrangement to create any desired size and shape of display system 10 (FIG. 1). Pixel elements 86 are preferably separated from each other by an isolation or rib structure 94 and are coated with a material 96 that protects the light emitting materials from ambient moisture (e.g., a parylene and silicon nitride coating layer).

In one exemplary embodiment, substrate 80 of web 50 is patterned with rib structures 94, pixel elements 86 and cathode contact 88 patterns running in row lines at right angle directions to ITO column lines (line 82). Substrate 80 with line 82, rib structures 94 and pixel elements 86 is coated with a dielectric material (e.g., parylene-C) which provides mechanical protection for pixel elements 86 and rib structures 94. Applicant has found that a parylene material has excellent electrical insulation properties and extremely low moisture absorption characteristics suitable for the environments of display system 10.

A layer of hydrogenated silicon nitride can complete layer 96. The hydrogenated silicon nitride material used in layer 96 forms a barrier preventing moisture and oxygen ingress from the backside of display system 10 and protects sensitive OLED pixel elements from moisture and oxygen-induced degradation.

Both the parylene and silicon nitride materials of layer 96 are vacuum deposited with special room temperature processes which are compatible with temperature-sensitive OLED pixel elements 86. The vacuum processes also ensure protection of the OLED materials associated with elements 86 against moisture or solvent contamination during processing. After layer 96 is formed, vias or contacts 84 and 88 are formed by laser ablation machining at locations exposing every column anode (line 82 beneath contacts 88, FIG. 4) and row cathode (beneath contact 84) in each node segment.

Figure 6:
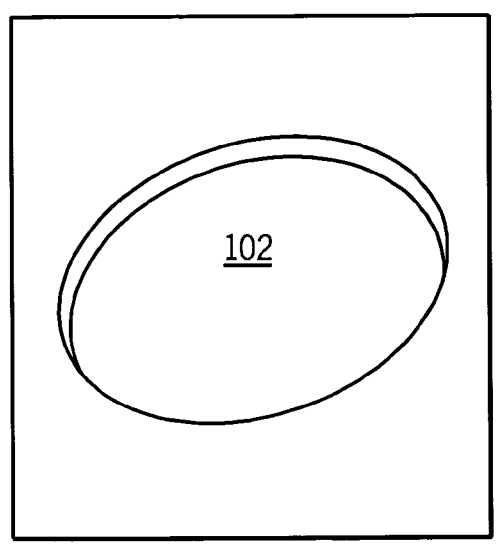
FIG. 6 is a representation of a cleanly machined laser-ablated via or hole for the pixel web illustrated in FIG. 5.

With reference to FIG. 6, an ablated hole 102 is created in layer 96. Hole 102 can be formed by excimer-based laser technology. Hole 102 is used to form contacts 84 and 88. Advantageously, hole 102 exposes line 82 or elements 86.

Excimer lasers operate with a photo-ablative mechanism as opposed to the thermal-ablation experienced with conventional lasers. Preferably, the laser ablation technique keeps materials associated with OLED pixel elements 86 at temperatures below 100° C. After hole 102 is formed, a conductive via in hole 102 is metallized and configured with large tabs associated with contacts 84 and 88, preferably by temperature-controlled thin film deposition.

Figure 7:
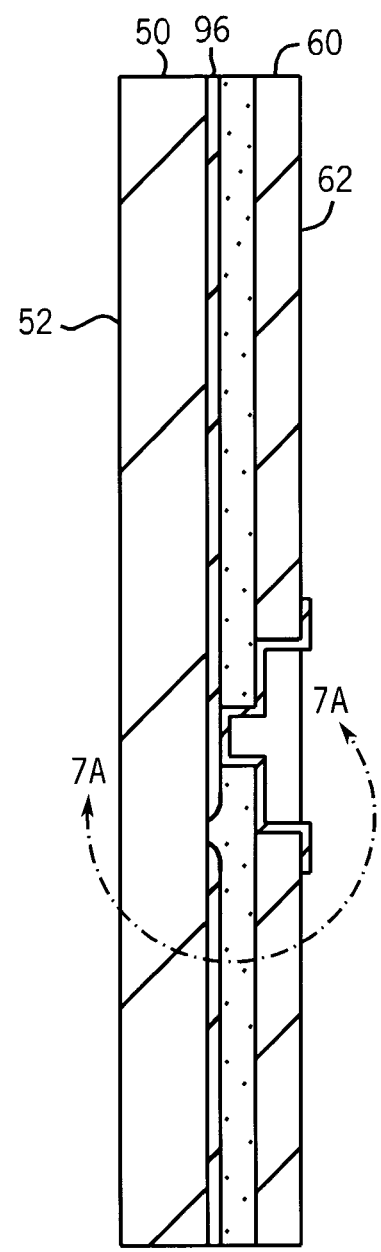
FIGS. 7 and 7A are a more detailed cross sectional view schematic drawings of the pixel web illustrated in FIG. 5 in accordance with another exemplary embodiment.
Figure 7A:
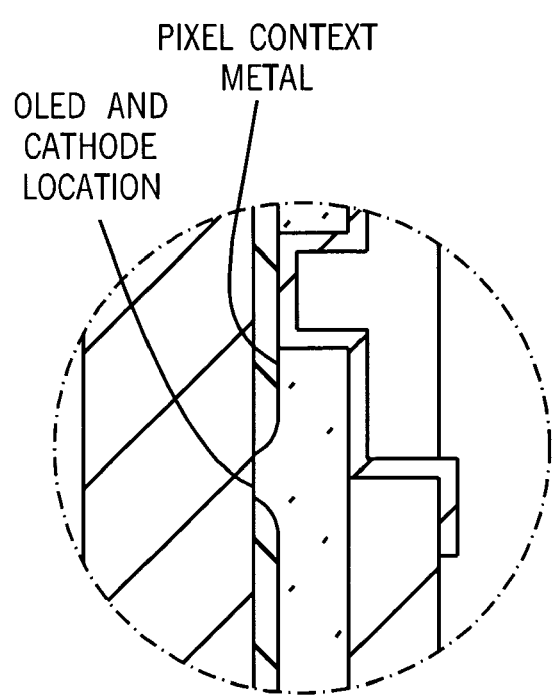

With reference to FIGS. 4 and 7, interconnect web 60 includes high density interconnections utilizing micro-via techniques. Web 60 is preferably manufactured using conventional flex circuit technology including polyimide core materials for high temperature stability and good electrical characteristics. Interconnect web 60 is preferably a web having two metal layers for routing signals to pixel web 50.

In FIG. 7, interconnect web 60 is connected to pixel web 50 with laser machined micro-via structures. The micro-via structures are preferably 100 micron diameter holes that are metallized to create connections between two conductive layers in interconnect web 60.

In one alternative embodiment, tile 12 (FIG. 4) does not include interconnect web 60 and instead is coupled to interposer module 70 at surface 54. In such a scheme, various connectors or interconnections can be utilized avoiding the necessity of interconnect web 60. In one embodiment, interposer module 70 is mounted directly to surface 54 of pixel web 50.

Pixel web 50 and interconnect web 60 can be adhered to each other. Adhesives should be chosen for good bonding and laser machining characteristics.

Figure 8:
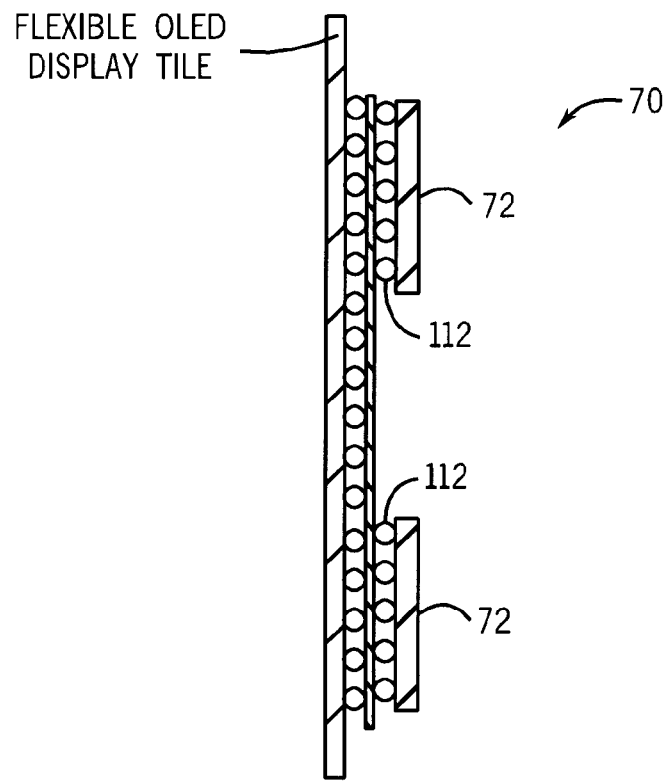
FIG. 8 is a side view of the tile illustrated in FIG. 2 in accordance with yet another exemplary embodiment.

With reference to FIGS. 4 and 8, interposer module 70 can be any type of device for housing circuitry for pixel web 50. In a preferred embodiment, interposer module 70 includes row and column driver integrated circuits to drive OLED pixel elements associated with web 50. Module 70 is preferably connected to web 60 or to web 50 in a process compatible with OLED limitations associated with web 50. Further, attachment of module 70 allows the final assembly to remain flexible, borderless, reliable and cost effective. Preferably, module 70 includes a substrate compatible with roll-to-roll web processing.

In one embodiment, silicon row and column driver ICs are mounted on a flexible substrate. Although not shown in FIG. 8, resistors and capacitors can also be coupled to module 70. Module 70 is moderately flexible with a large radius of curvature despite the presence of relatively stiff assemblies 72. Assembly 72 can be coupled by solder balls 112 to substrates associated with module 70. As shown in FIG. 4, assembly 72 can be coupled by flexible leads to module 70.

As shown in FIG. 3, short-flex-circuit cables such as connectors 28A–C can be used to interconnect tiles 12A–C with off-display circuit boards. Preferably, off-display driver electronics are carried on a single flexible circuit board.

Figure 9:
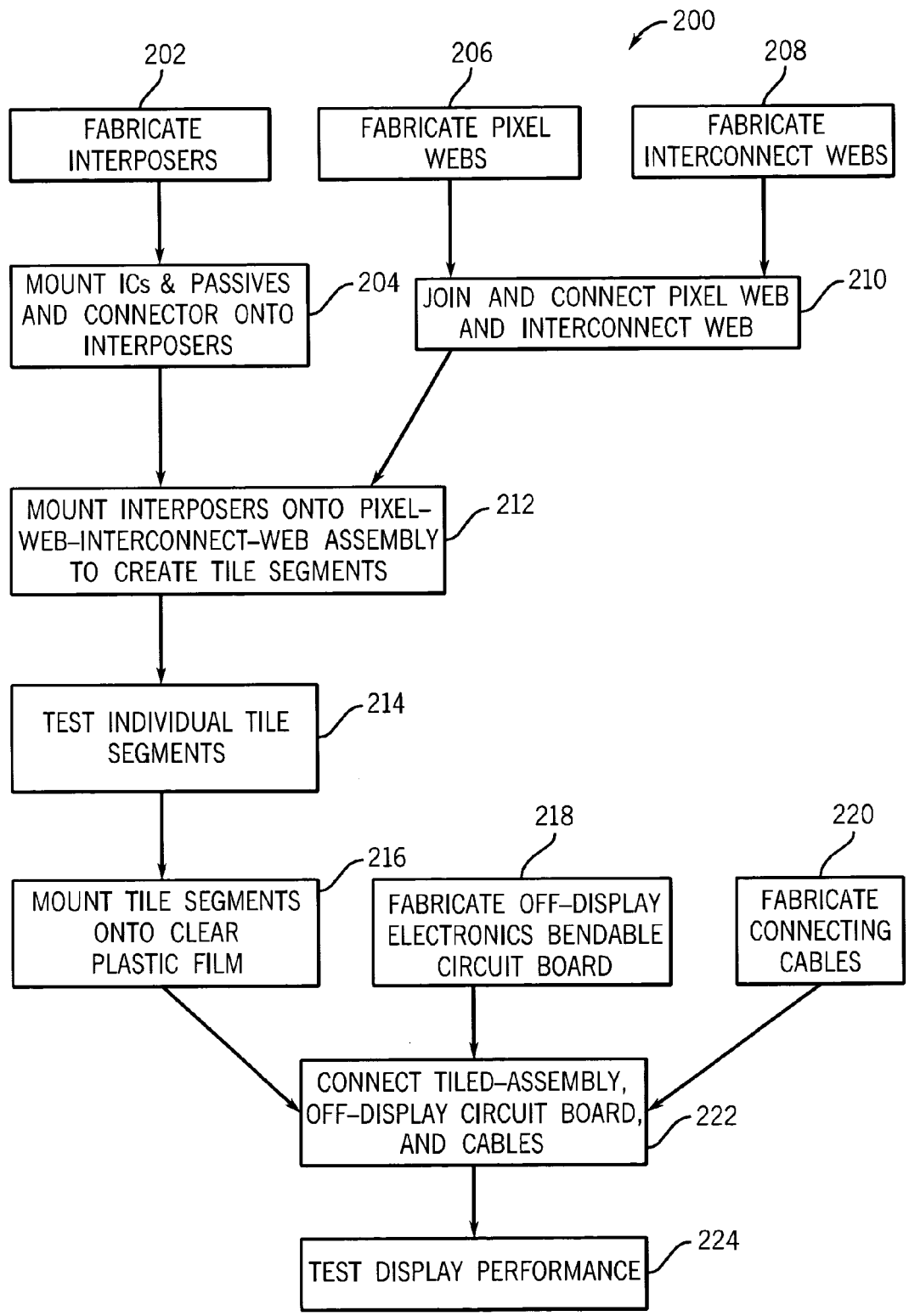
FIG. 9 is a schematic flow diagram showing manufacturing steps associated with the display system illustrated in FIG. 1 in accordance with still yet another exemplary embodiment.

With reference to FIG. 9, a process 200 for fabricating display system 10 is described below. At a step 202, interposer module 70 substrates for interposer module 70 are formed and assembly 72 is attached at a step 204. At a step 206, pixel webs 50 are formed. At a step 208, interconnect web 60 is formed. Pixel web 50 and interconnect web 60 are joined at a step 210. Preferably, large sections (including portions associated with more than one tile 12) are connected together at this time.

Alternatively, individual sections of webs 50 and 60 can be joined individually for each tile. At a step 212, interposer module 70 is attached to web 60 or to web 50 to form a tile 12. At a step 214, tiles 12 are tested.

At a step 216, tiles 12 are attached to a medium 14. At a step 218, off-display electronics are attached to a circuit board 26, and cables 28A–C are formed at a step 220. At a step 222, circuit board 26 and cables 28A–C are connected to tiles 12A–C. At a step 224, system 10 is tested.

With reference to FIGS. 10–27, an exemplary structure for a pixel web 50 and method of manufacturing pixel web 50 is described. The discussion below provides a description of an exemplary embodiment of pixel web 50 and an exemplary embodiment of the fabrication method for web 50. Pixel web 50 can have a variety of structures and can utilize a variety of technologies without departing from the scope of the invention.

Figure 10:
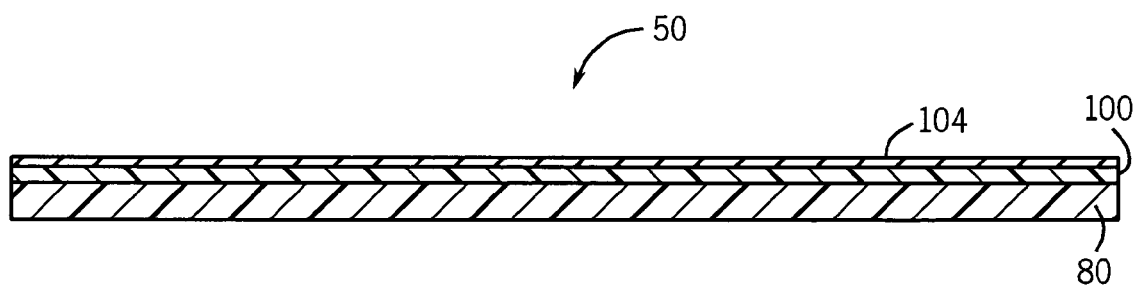
FIG. 10 is a cross sectional view schematic drawing of a substrate for the pixel web illustrated in FIG. 5 having a transparent electrical conductor layer deposition step.

In FIG. 10, pixel web 50 includes substrate 80 (e.g., a Vitex7 film) with moisture barrier layers 100 and a conductive layer 104. Layer 104 can be any transparent conductive material, such as, but not limited to Indium Tin Oxide (ITO).

Figure 11:
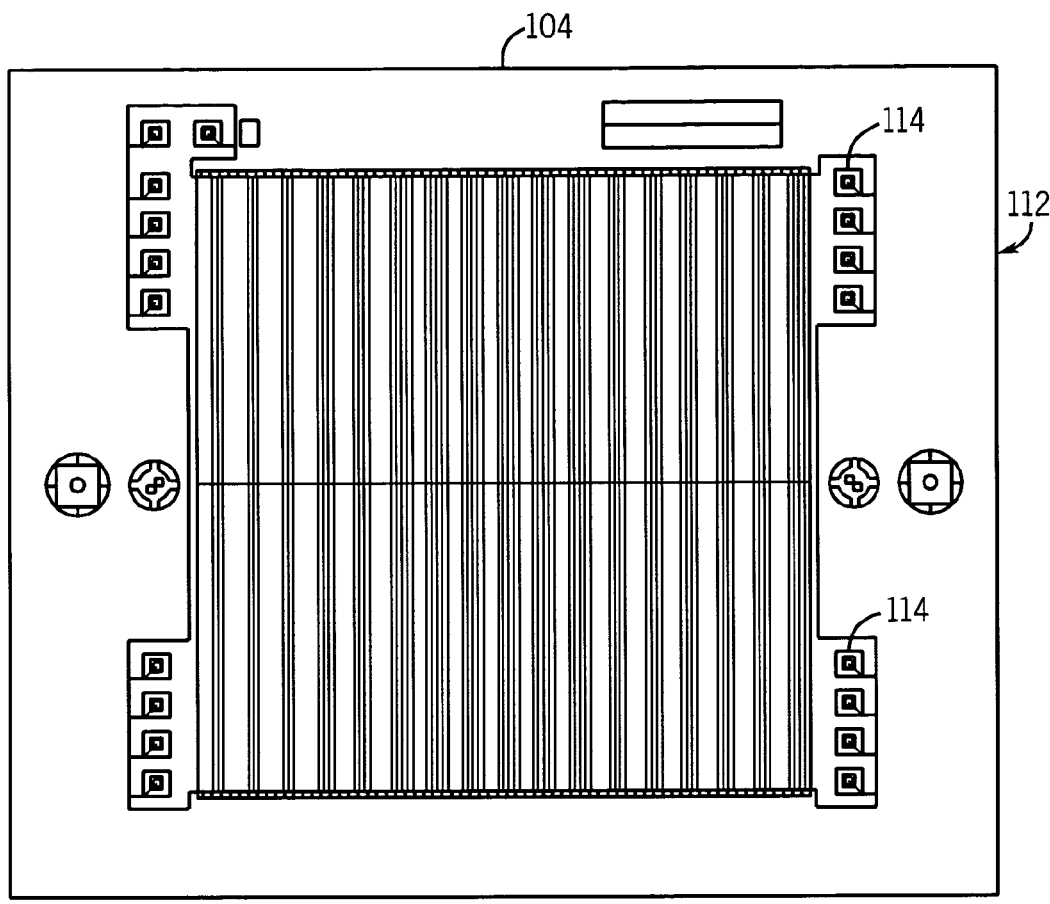
FIG. 11 is a top view schematic drawing of a patterned transparent electrical conductor layer for the pixel web illustrated in FIG. 5 in accordance with another exemplary embodiment.

In FIG. 11, a pattern 112 of anode connections to OLED elements (elements 86 in FIG. 5) can be formed in layer 104. The etching of layer 104 for pattern 112 is described below with reference to FIG. 13. Preferably, pattern 112 is comprised of parallel conductive lines.

Pattern 112 associated with conductive layer 104 includes numerous fiducial alignment marks 114 located outside the active area of pattern 112. Marks 114 are used for precise alignments of several layers which are added on top of layer 104 as discussed below.

Figure 12:
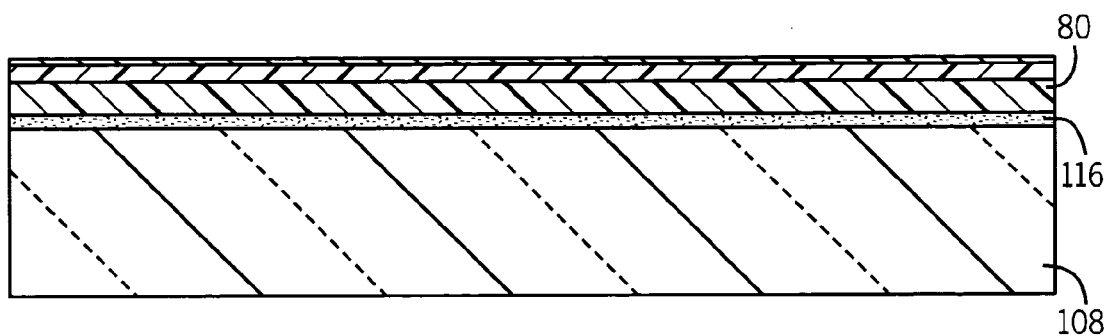
FIG. 12 is a cross sectional view schematic drawing of the substrate illustrated in FIG. 10 showing a glass carrier attachment step.

In FIG. 12, substrate 80 is bonded to an identically sized glass fabrication panel or plate 108. The use of plate 108 is for manufacturing convenience. Plate 108 can be temporarily bonded by an adhesive 116.

Alternatively, plate 108 can be permanently bonded to substrate 80. A permanent bond is particularly useful if substrate 80 does not include adequate internal moisture barriers. Process steps described with reference to FIGS. 13–27 can be performed with or without glass carrier plate 108 shown in FIG. 12.

Figure 13:
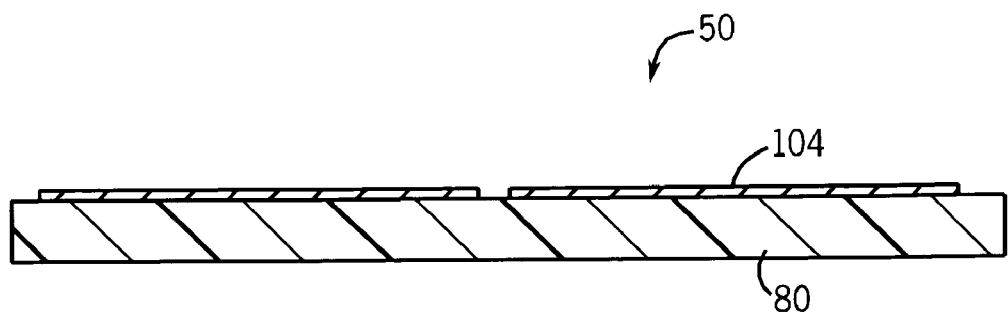
FIG. 13 is a cross sectional schematic drawing of the substrate illustrated in FIG. 10, showing a transparent electrical conductor patterning step.

In FIG. 13, layer 104 is etched in accordance with pattern 112 (FIG. 11). Layer 104 can be etched in a dry or wet etching process. Preferably, layer 104 is an ITO material that is patterned by chemical etching or a laser etching process.

Figure 14:
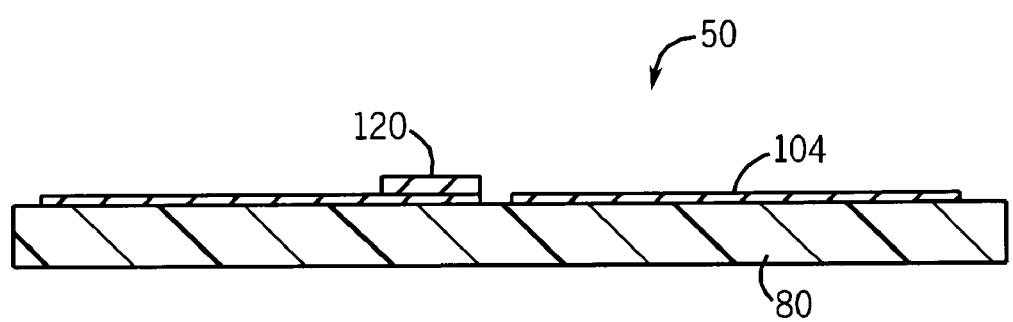
FIG. 14 is a cross sectional schematic drawing of the substrate illustrated in FIG. 13, showing a metal pad formation step.

In FIG. 14, layer 104 is selectively electroplated to form a conductive pad 120. Conductive pad 120 is preferably an electroplated metal layer provided on each of the 240 column segments (120 top and 120 bottom column segments in FIG. 2). Conductive pad 120 can act as a laser stop for Z axis interconnections to column segments. Further, the metal layer associated with conductive pad 120 can cover borders and fiducials associated with pattern 112. In one embodiment, pad 120 is an electroplated gold over nickel structure.

Figure 15:
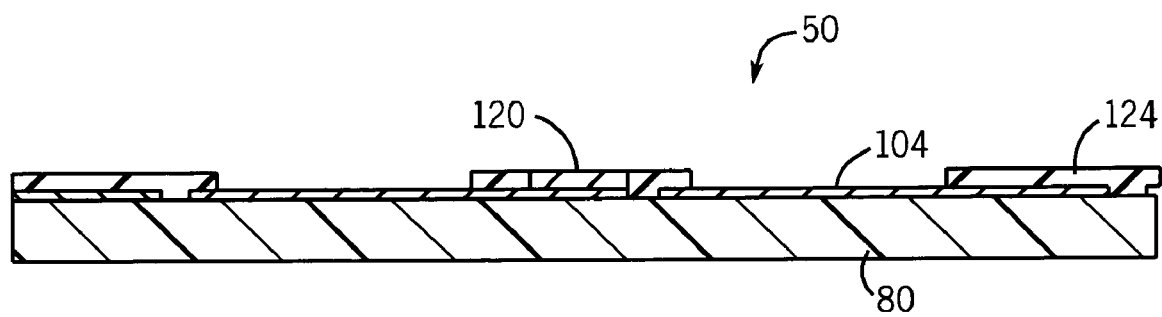
FIG. 15 is a cross sectional view schematic drawing of the substrate illustrated in FIG. 14, showing an insulative pedestal formation step.

In FIG. 15, an insulative layer 124 is provided above substrate 80 and layer 104. Preferably, layer 124 is an insulative pedestal layer which defines individual pixel sizes. Preferably, layer 124 is a photoimageable dielectric material.

Figure 16:
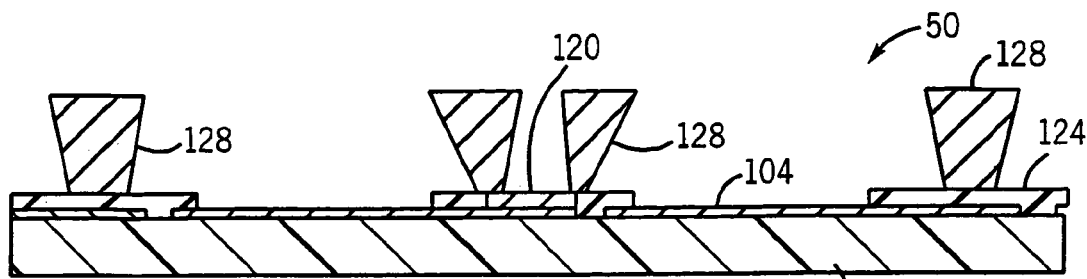
FIG. 16 is a cross sectional view schematic drawing of the substrate illustrated in FIG. 15, showing a rib formation step.

In FIG. 16, rib structures 128 are provided above layer 124 and conductive pad 120. Rib structures 128 preferably have a triangular or trapezoidal shape with a wider portion at a top end. Preferably, rib structures 128 are wider at via interconnections associated with the ITO anode (conductive pad 120). Rib structure 128 associated with conductive pad 120 also includes a hole for interconnection to conductive pad 120. Preferably, rib structures 128 are made using a photoimageable dielectric material.

Figure 17:
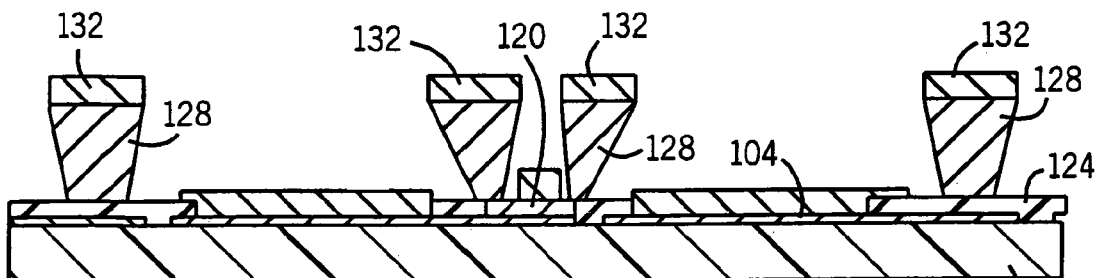
FIG. 17 is a cross sectional view schematic drawing of the substrate illustrated in FIG. 16, showing an OLED material deposition step.

In FIG. 17, OLED pixel materials 132 are deposited through a shadow mask above layer 104 and rib structures 128. OLED materials 132 preferably do not adhere to layer 124. OLED materials 132 can be deposited in a selective process such as vapor deposition. Materials 132 are deposited to form light emitting pixel elements.

Figure 18:
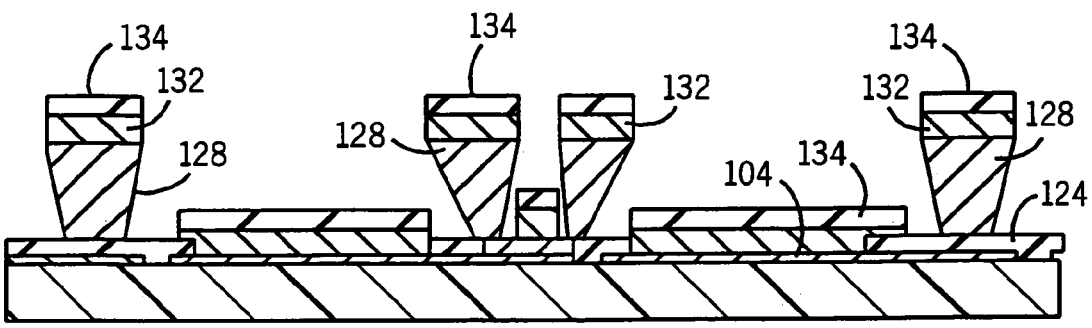
FIG. 18 is a cross sectional view schematic drawing of the substrate illustrated in FIG. 17, showing a cathode contact formation step.
Figure 19:
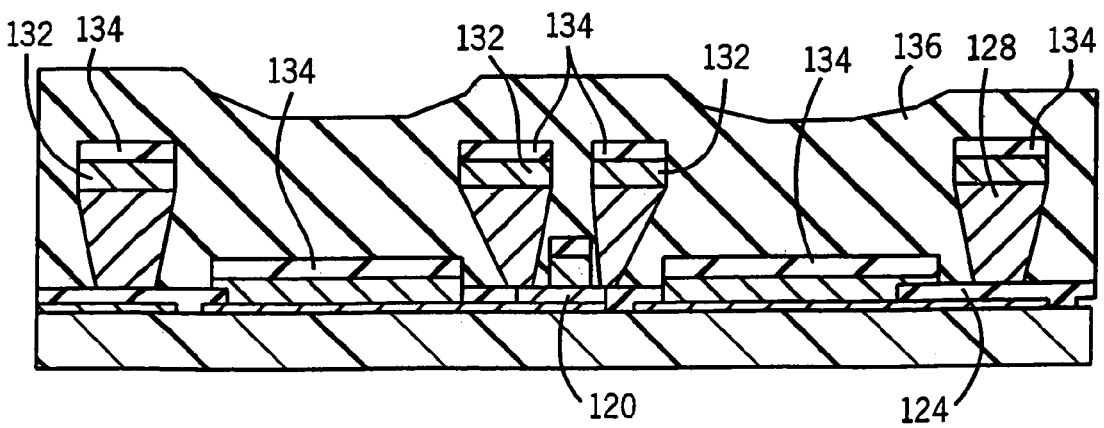
FIG. 19 is a cross sectional view schematic drawing of the substrate illustrated in FIG. 18, showing an insulative layer deposition step.

In FIG. 18, a cathode conductor layer 134 is deposited above OLED pixel material 132. Layer 134 is preferably a metal layer acting as a cathode contact. Layer 134 can be an electrically conductive material deposited by chemical vapor deposition. In FIG. 19, an insulating layer 136 is deposited above layer 134, layer 124, and conductive pad 120. Insulative layer 136 is preferably a parylene insulating layer which surrounds rib structures 128.

Figure 20:
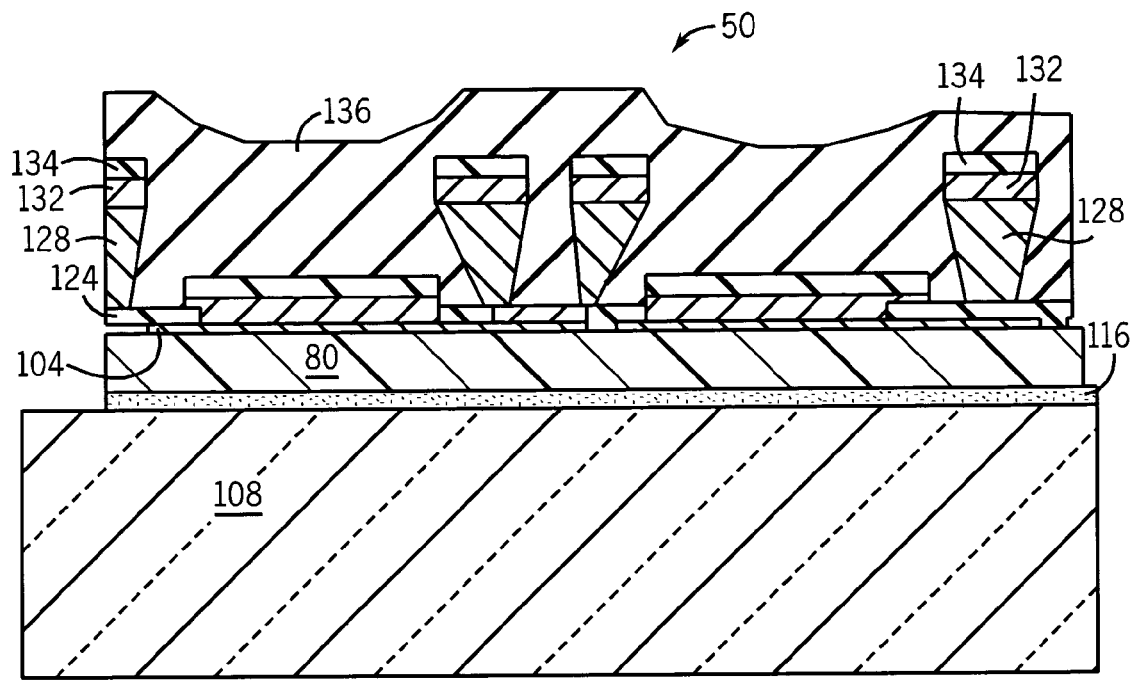
FIG. 20 is a cross sectional view schematic drawing of the substrate illustrated in FIG. 19, showing a laser cutting step.

In FIG. 20, a laser groove is cut around the perimeter of web 50. Preferably, portions of layer 136, layer 134, OLED material 132, rib structure 128, layer 124, layer 104, substrate 80 and adhesive 116 are all removed in the laser process.

Figure 21:
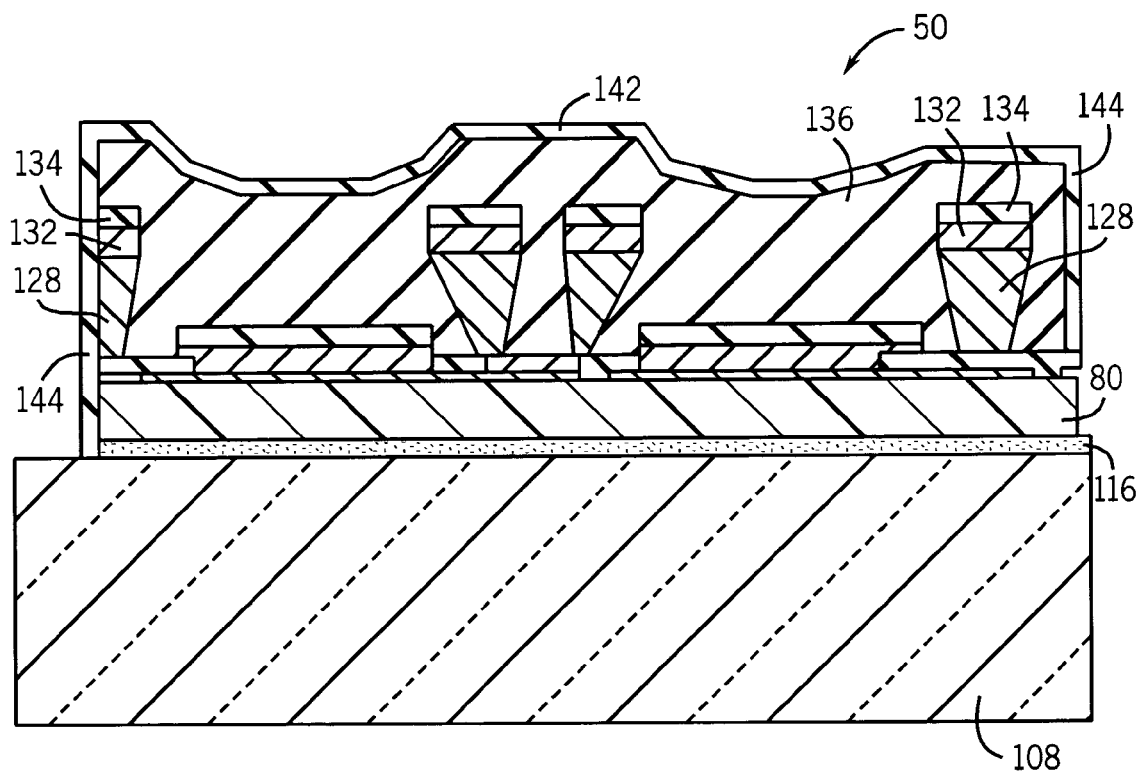
FIG. 21 is a cross sectional view schematic drawing of the substrate illustrated in FIG. 20, showing a silicon nitride deposition step.

In FIG. 21, a barrier layer 142 is deposited above layer 136. Preferably, barrier layer 142 is provided at a perimeter 144 of web 50. Preferably, barrier layer 146 is a silicon nitride layer that is deposited by vapor deposition over the entire backside of web 50 sealing both the back and edges of web 50 from moisture penetration.

Figure 22:
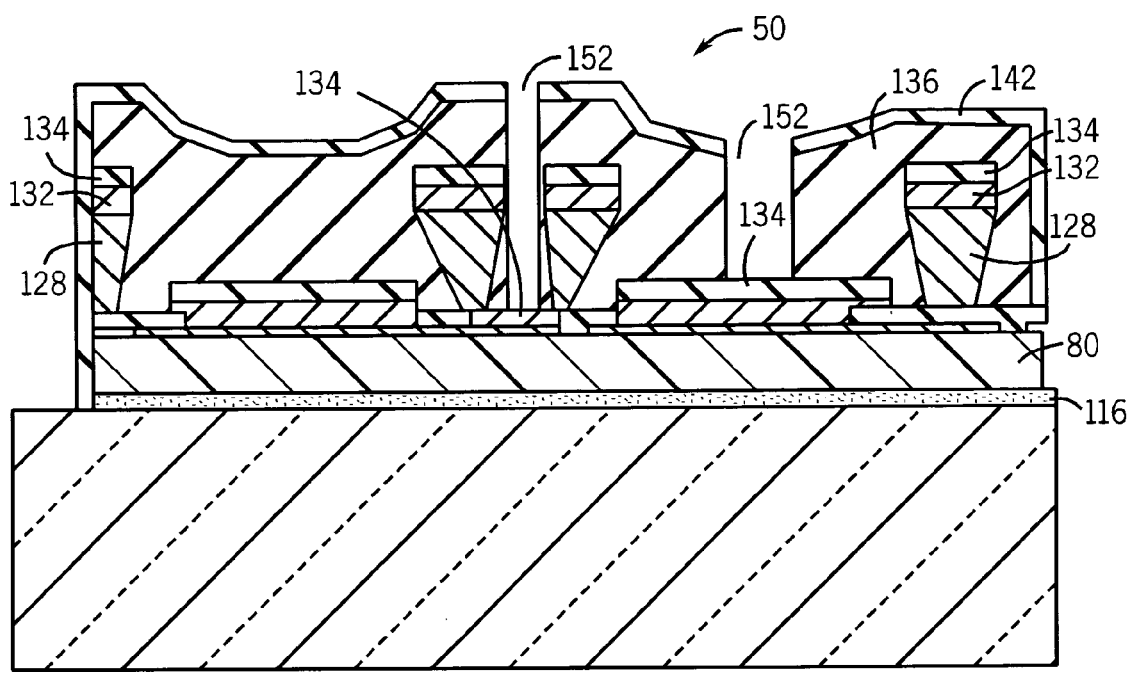
FIG. 22 is a cross sectional view schematic drawing of the substrate illustrated in FIG. 22, showing a laser machining step.

With reference to FIG. 22, laser holes 152 similar to hole 102 (FIG. 7) are provided through layers 142 and 136. Layer 134 acts as a stopping point for holes 152. Preferably, web 50 includes 240 holes to connect to two sets of 120 laser stop pads associated with the ITO columns and 120 holes to connect 120 rows associated with web 50.

Figure 23:
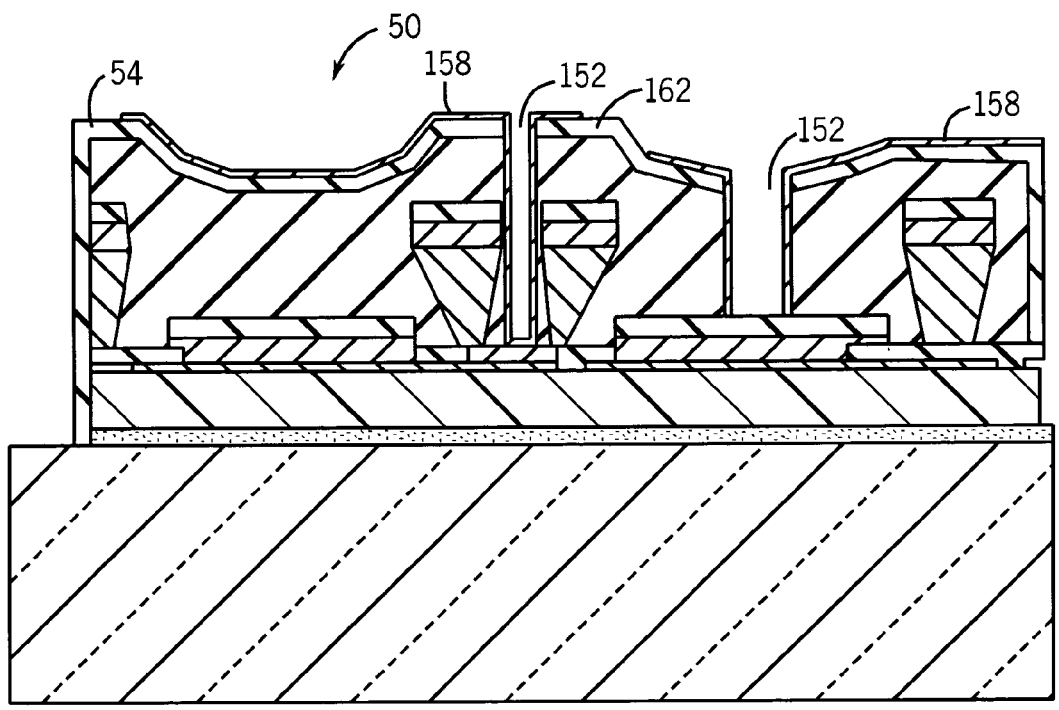
FIG. 23 is a cross sectional view schematic drawing of the substrate illustrated in FIG. 21, showing a conductive via formation step.

In FIG. 23, holes 152 are filled with a conductive material such as a conductive layer 158. Preferably, conductive layer 158 is metal and is not connected between hole 152 associated with an anode contact and hole 152 associated with a cathode contact due to an isolation area 162. Preferably, layer 158 is deposited through a shadow mask for forming the bottom of via interconnections associated with the anodes and cathodes of web 50. In addition, layer 158 can be utilized to form contact pads associated with surface 54 of web 50 (FIG. 5). Layer 158 preferably serves as a laser stop pad.

Figure 24:
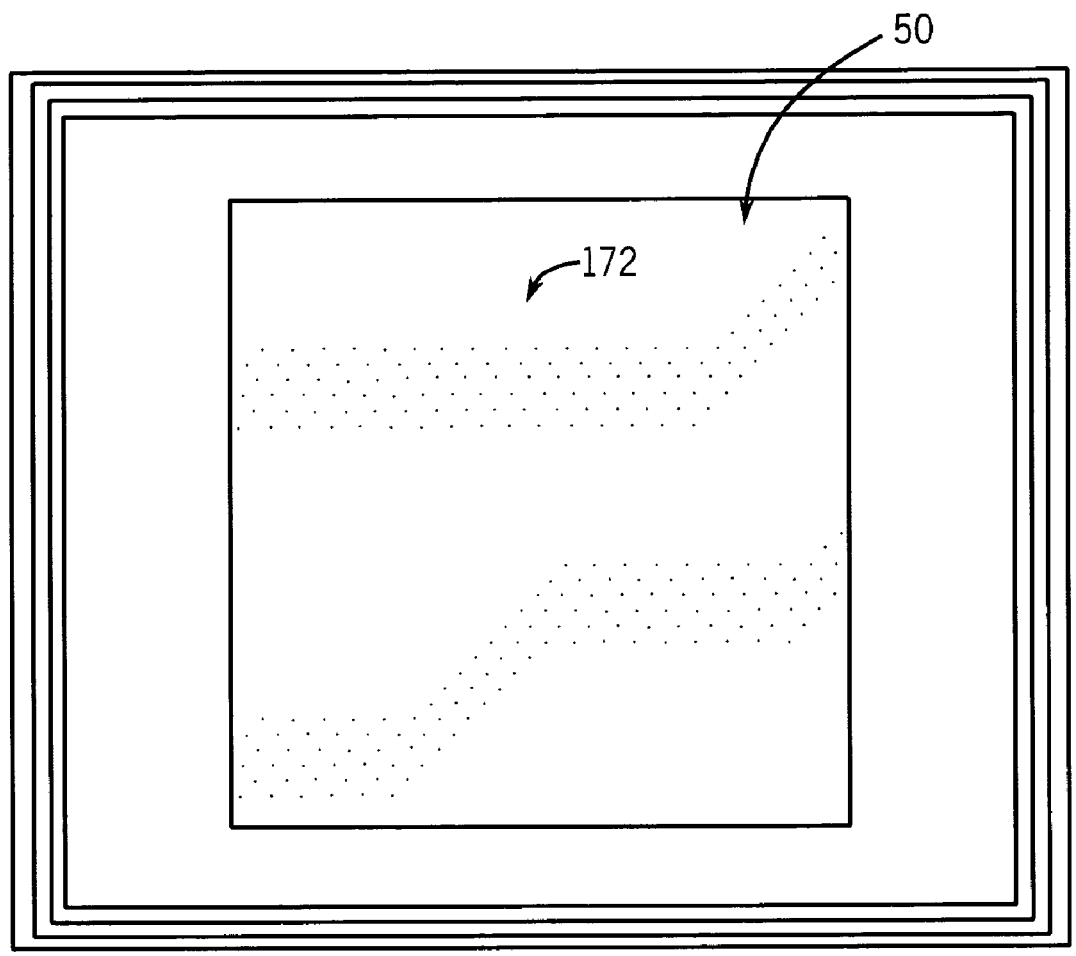
FIG. 24 is a top view schematic drawing showing anode contacts for the pixel web illustrated in FIG. 5.
Figure 25:
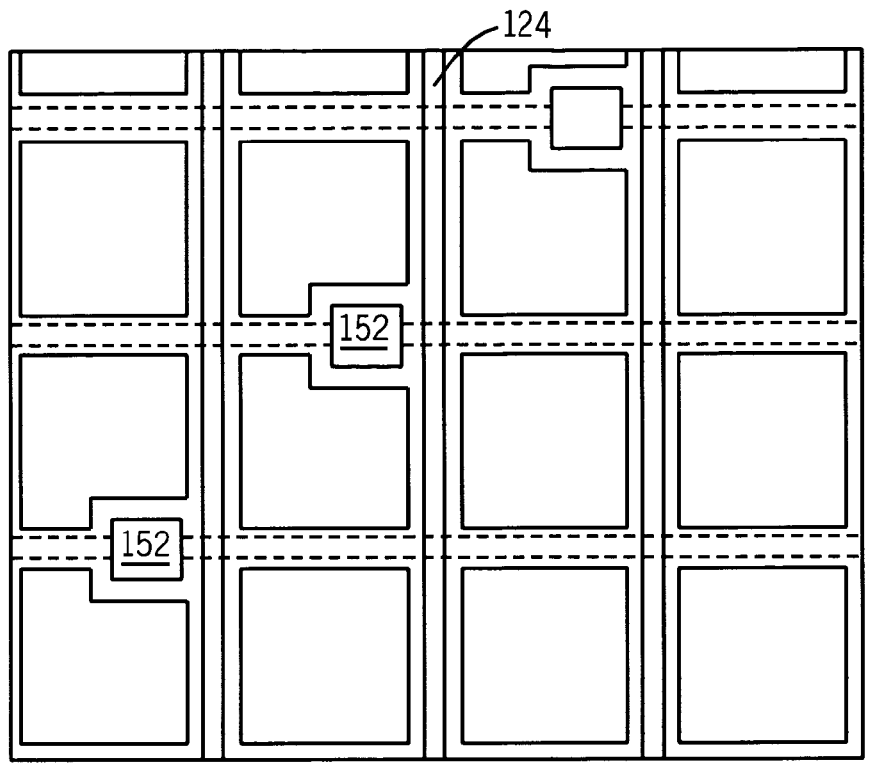
FIG. 25 is a top view schematic drawing showing pedestal structures for the pixel web illustrated in FIG. 5.
Figure 26:
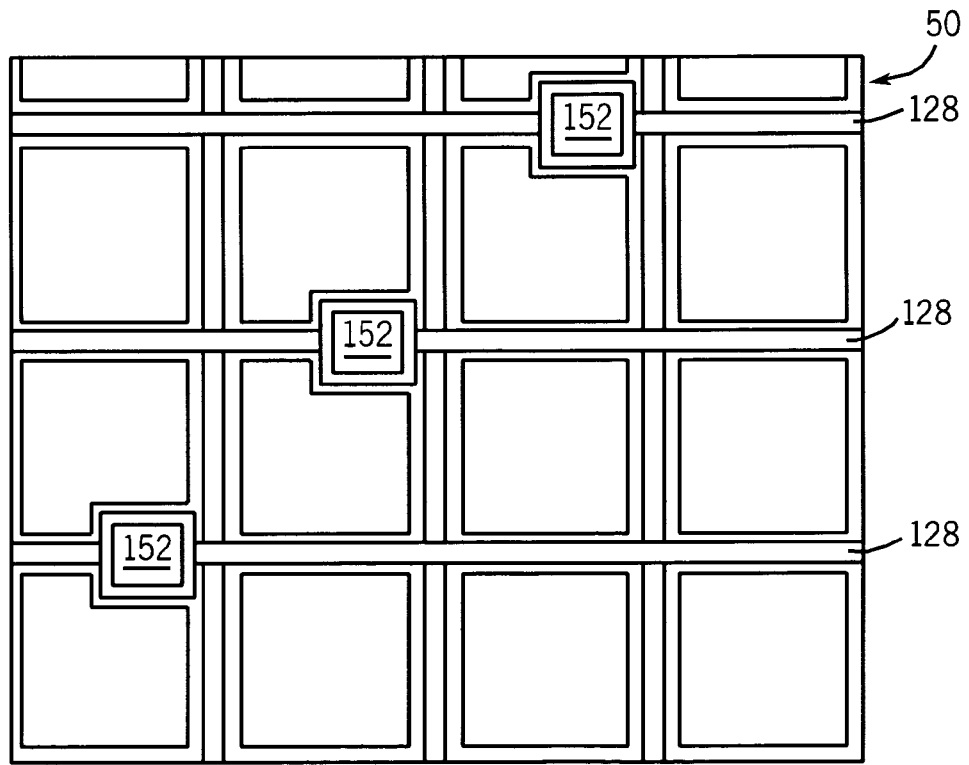
FIG. 26 is a top view schematic drawing showing rib structures for the substrate illustrated in FIG. 5.
Figure 27:
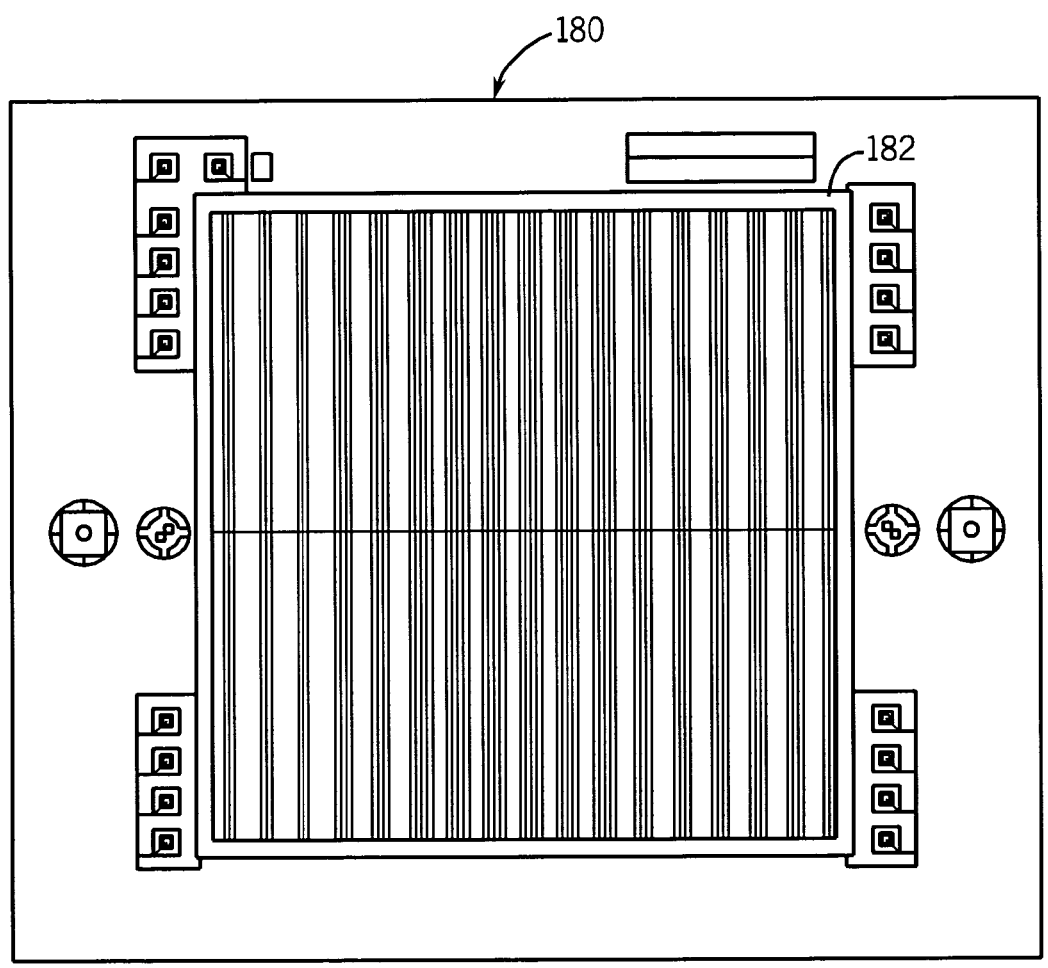
FIG. 27 is a top view schematic drawing showing a laser machine groove associated with the step illustrated in FIG. 20.

With reference to FIG. 24, an exemplary pattern 172 of laser stop pads for anode connection on web 50 is shown. With reference to FIG. 25, an exemplary pattern for pedestal structures 128 on web 50 is shown. With reference to FIG. 26, an exemplary pattern for rib structures 124 on web 50 is shown. With reference to FIG. 27, an exemplary pattern 180 shows a laser machine groove 182 about its perimeter formed after deposition of layer 142.

It is understood that while the detailed drawings, specific examples, material types, thicknesses, dimensions, and particular values given provide preferred exemplary embodiments of the present invention, the preferred exemplary embodiments are offered for the purpose of illustration only. The method and apparatus of the invention is not limited to the precise details and conditions disclosed. For example, although specific types of web materials are described, other structures can be utilized. Further, although OLED technology is discussed, other technologies can be utilized to provide light from a surface of a pixel web. Yet further, the various patterns shown can be replaced by other suitable patterns and the present invention is not limited to any particular circuit pattern. Various changes can be made to the details disclosed without departing from the scope of the invention which is defined by the following claims.

What is claimed is:

1. A display system, comprising:
   a plurality of tiles, each tile of the tiles including a matrix of pixel elements, the pixel elements selectively providing light at a first surface of the tile in response to address signals, the pixel elements being coupled to an address circuit via contacts at a second surface, the first surface being opposite the second surface;
   wherein the contacts extend below the second surface and are coupled to the pixel elements, wherein the contacts are disposed between rib structures, wherein the rib structures are not other contacts;
   an interconnect member coupled to the second surface, the interconnect member including a front surface coupled to the second surface, and a back surface opposite the front surface, wherein conductive vias extend from the front surface to the back surface, the conductive vias being coupled to the contacts; and
   a medium having a mounting surface, the plurality of tiles being attached to or above the mounting surface.

2. The display system of claim 1, wherein the medium is transparent and the tiles are mounted so that the first surface is closer to the mounting surface than the second surface.

3. The display system of claim 1, wherein the medium is flexible.

4. The display system of claim 1, wherein the address signals are row and column address signals.

5. The display system of claim 1, further comprising:
   an interposer coupled to the interconnect member, the interposer including the address circuit.

6. The display system of claim 5, wherein the interposer is coupled to the interconnect member by flexible leads and the interconnect member is a flexible circuit board.

7. A cockpit display, comprising:
   a plurality of display tiles, at least one tile of the display tiles including a matrix of pixel elements that form a pixel web, the display tiles including contacts at a second surface of the pixel web, a first surface being opposite the second surface;
   wherein the contacts extend below the second surface and are coupled to the pixel elements, wherein the contacts are disposed between rib structures, wherein the rib structures include dielectric material;
   an interconnect member coupled to the second surface, the interconnect member including a front surface coupled to the second surface, and a back surface opposite the front surface, wherein conductive vias extend from the front surface to the back surface, the conductive vias being coupled to the contacts; and
   a medium having a mounting surface, the plurality of display tiles being attached to or above the mounting surface at the first surface.

8. The cockpit display of claim 7, wherein the medium is flexible.

9. The cockpit display of claim 8, wherein the interconnect member is flexible.

10. A display apparatus, comprising:
    first means for providing first light from first pixel elements at a first surface, the first surface being opposite a second surface, the second surface including first contacts, the first contacts being disposed between rib structures, wherein the rib structures are insulated electrically from the first contacts;
    an interconnect member coupled to the second surface, the interconnect member including a front surface coupled to the second surface, and a back surface opposite the front surface, wherein conductive vias extend from the front surface to the back surface, the conductive vias being coupled to the contacts;
    first means for providing first paths for first electric signals, the first paths being connected to the first contacts, the first means for providing first paths being mounted behind the second surface and being closer to the second surface than the first surface;
    second means for providing second light from second pixel elements at a third surface, the third surface being opposite a fourth surface, the fourth surface including second contacts,
    second means for providing second paths for second electric signals, the second paths being connected to the second contacts, the second means for providing second paths being mounted behind the fourth surface and being closer to the fourth surface than the third surface; and
    means for providing the first electric signals and second electric signals to the first means for providing first paths and the second means for providing second paths, the first electric signals and second electric signals controlling the first light and the second light.

11. The display apparatus of claim 10, further comprising:
means for providing display signals from a remote location to the means for providing the electric signals.

12. A method of operating a display, the method comprising:
providing first electric signals from behind a back surface of a first pixel web to the back surface of the first pixel web, the first pixel web being located on a first tile, the first pixel web including contacts on the back surface, and an interconnect member coupled to the back surface, the interconnect member including a front surface coupled to the back surface, and a second surface opposite the front surface, wherein conductive vias extend from the front surface to the second surface, the conductive vias being coupled to the contacts, the contacts being disposed between rib structures, wherein the rib structures are non-conductive material;
providing light at a front surface of the first pixel web on the first tile in accordance with the first electric signals;
providing second electric signals from behind a back surface of a second pixel web to the back surface of the second pixel web, the second pixel web being located on a second tile;
providing light at a front surface of the second pixel web on the second tile in accordance with the second electric signals.

13. The method of claim 12, wherein the first electric signals travel from the back surface to the front surface through conductive vias extending through the pixel web.

14. The method of claim 13, wherein the first pixel web and the second pixel web are attached to a medium, the first pixel web having a first edge adjacent a second edge of the second pixel web.

15. A method of manufacturing a display system, the method comprising:
providing a plurality of tiles, each of the tiles having a first surface and a second surface parallel with a first plane and an interconnect member coupled to the second surface, wherein the first surface includes a plurality of pixel elements for selectively providing light, the second surface including a plurality of contacts electrically associated with the pixel elements, the interconnect member including a front surface coupled to the second surface, and a back surface opposite the front surface, wherein conductive vias extend from the front surface to the back surface, the conductive vias being coupled to the contacts, the contacts being disposed between rib structures, the rib structures including dielectric material;
providing a transparent carrier medium; and
attaching the tiles to a carrier medium.

16. The method of claim 15, wherein the carrier medium is a plastic film.

17. The method of claim 16, further comprising:
electrically coupling a conductor to at least one of the contacts on the second surface to a circuit board.

18. A display comprising:
a plurality of tiles, each of the tiles having a first surface and a second surface parallel with a first plane and an interconnect member coupled to the second surface, wherein the first surface includes a plurality of pixel elements for selectively providing light, the second surface including a plurality of contacts electrically associated with the pixel elements, the interconnect member including a front surface coupled to the second surface, and a back surface opposite the front surface, wherein conductive vias extend from the front surface to the back surface, the conductive vias being coupled to the contacts, wherein conductive vias extend from the contacts to the pixel elements in a direction relatively perpendicular to the first plane, the conductive vias being disposed between rib structures, wherein the rib structures are trapezoidally shaped.

19. The display of claim 18, wherein edges of the tiles do not include interconnections, all interconnections for the tiles being accomplished in the direction relatively perpendicular to the first plane.

* * * * *